(12) United States Patent
Chen et al.

(10) Patent No.: US 9,995,998 B2
(45) Date of Patent: Jun. 12, 2018

(54) METHOD AND APPARATUS FOR INTEGRATED CIRCUIT LAYOUT

(71) Applicant: TAIWAN SEMICONDUCTOR MANUFACTURING COMPANY, LTD., Hsin-Chu (TW)

(72) Inventors: Yi-Fan Chen, New Taipei (TW); Tung-Heng Hsieh, Hsinchu County (TW); Chin-Shan Hou, Hsin-Chu (TW); Yu-Bey Wu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 60 days.

(21) Appl. No.: 15/188,753

(22) Filed: Jun. 21, 2016

(65) Prior Publication Data

US 2016/0370698 A1 Dec. 22, 2016

Related U.S. Application Data

(63) Continuation of application No. 14/081,615, filed on Nov. 15, 2013, now Pat. No. 9,377,680.

(51) Int. Cl.
*G03F 1/36* (2012.01)
*G06F 17/50* (2006.01)

(52) U.S. Cl.
CPC ............ *G03F 1/36* (2013.01); *G06F 17/5068* (2013.01); *G06F 17/5081* (2013.01)

(58) Field of Classification Search
CPC .............................. G03F 1/36; G06F 17/5068
See application file for complete search history.

(56) References Cited

U.S. PATENT DOCUMENTS

| | | |
|---|---|---|
| 6,001,512 A | 12/1999 | Tzu |
| 8,168,529 B2 | 5/2012 | Lin et al. |
| 8,330,248 B2 | 12/2012 | Tabata et al. |
| 2008/0244475 A1 | 10/2008 | Lo et al. |
| 2009/0212794 A1 | 8/2009 | Chang et al. |
| 2013/0017474 A1 | 1/2013 | Chiang |
| 2013/0027075 A1 | 1/2013 | Shao et al. |

*Primary Examiner* — Stephen Rosasco
(74) *Attorney, Agent, or Firm* — Haynes and Boone, LLP

(57) ABSTRACT

A method includes receiving a layout of an integrated circuit (IC) device, the layout having an outer boundary and an inner boundary thereby defining a first region between the outer boundary and the inner boundary and placing a first plurality of dummy patterns in the first region, wherein the first plurality of dummy patterns is lithographically printable. The method further includes performing an Optical Proximity Correction (OPC) process, the first plurality of dummy patterns being position within the first region in such a way that prevents sub-resolution assist features from being inserted into the first region by the OPC process.

20 Claims, 8 Drawing Sheets

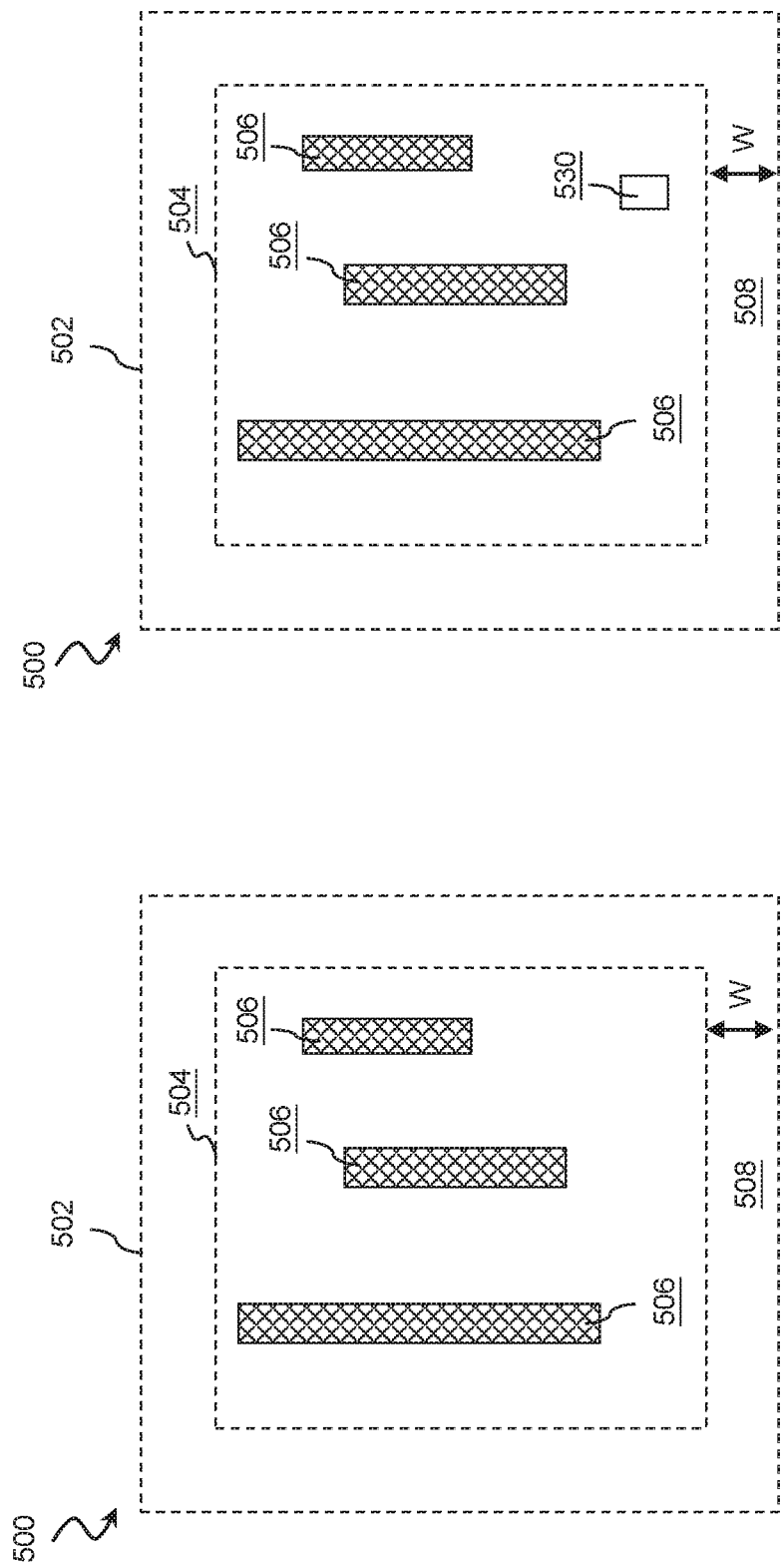

METHOD AND APPARATUS FOR INTEGRATED CIRCUIT LAYOUT

PRIORITY INFORMATION

This application is a continuation of U.S. application Ser. No. 14/081,615 filed Nov. 15, 2013, and entitled "Method and Apparatus for Integrated Circuit Layout," now issued U.S. Pat. No. 9,377,680, the disclosure of which is hereby incorporated by reference in its entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, in IC manufacturing, testlines (or test keys) are frequently included in a semiconductor wafer, often in scribe line areas between adjacent wafer dies. Each testline typically includes a plurality of testing devices which may be similar to those used to form IC products in the wafer die area. By studying parametric test results in the testing devices, it is possible to detect IC manufacturing errors and monitor the performance of various stages of the IC manufacturing process.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
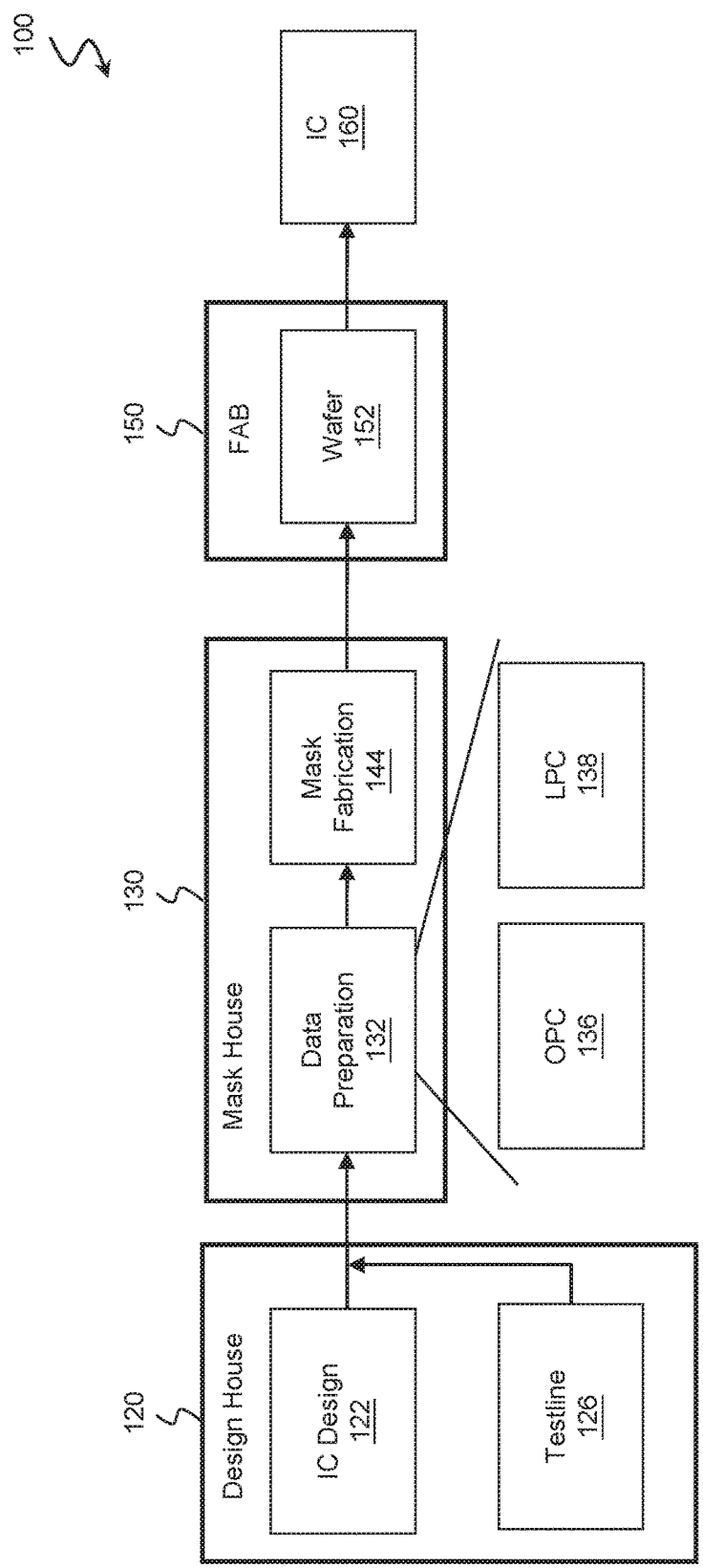
FIG. 1 is a simplified block diagram of an embodiment of an integrated circuit (IC) manufacturing system and an associated IC manufacturing flow.

The following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90degrees or at other orientations) and the spatially relative descriptors used herein may likewise be interpreted accordingly.

FIG. 1 is a simplified block diagram of an embodiment of an integrated circuit (IC) manufacturing system 100 and an IC manufacturing flow associated therewith. The IC manufacturing system 100 includes a plurality of entities, such as a design house 120, a mask house 130, and an IC manufacturer 150 (i.e., a fab), that interact with one another in the design, development, and manufacturing cycles and/or services related to manufacturing an integrated circuit (IC) device 160. The plurality of entities are connected by a communications network, which may be a single network or a variety of different networks, such as an intranet and the Internet, and may include wired and/or wireless communication channels. Each entity may interact with other entities and may provide services to and/or receive services from the other entities. One or more of the design house 120, mask house 130, and IC manufacturer 150 may be owned by a single larger company, and may even coexist in a common facility and use common resources. Each entity includes one or more computers (FIG. 8) connected to the communications network for performing, monitoring, and/or facilitating various tasks, including those described below.

The design house (or design team) 120 generates an IC design layout 122. The IC design layout 122 includes various geometrical patterns designed for an IC product, based on a specification of the IC product to be manufactured. The geometrical patterns correspond to patterns of metal, oxide, or semiconductor layers that make up the various components of the IC device 160 to be fabricated in die areas of a wafer 152, The various layers combine to form various IC features. For example, a portion of the IC design layout 122 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. The design house 120 implements a proper design procedure to form the IC design layout 122. The design procedure may include logic design, physical design, and/or place and route. The IC design layout 122 is presented in one or more data files having information of the geometrical patterns. For example, the IC design layout 122 can be expressed in a GDSII file format or DFII file format.

In an embodiment, the design house (or design team) 120 also generates one or more testline (or test key) layouts 126. For the sake of simplicity, a testline and its layout are used interchangeably in the present disclosure unless specifically distinguished. Each of the testlines 126 may include a plurality of test devices which are designed and implemented for monitoring various stages of wafer fabrication 150. For example, a test device may include one or more circuit elements, either passive or active or a combination thereof, such as a transistor (e.g., field-effect transistor FET or bipolar junction transistor BJT), a resistor, a capacitor, an inductor, a contact, a via, an electrical fuse (e-fuse), a memory cell, etc. The testlines 126 may further include testing pads and other circuitry for conducting the tests through the test devices. The testlines 126 are usually placed in scribe line areas of the wafer 152 that surround the die areas of the wafer 152. In an embodiment, the testlines 126 may also be placed in the die areas of the wafer 152. The testlines 126 are presented in one or more data files having information of various geometrical patterns of the test devices. For example, the testlines 126 can be expressed in a GDSII file format or DFII file format.

The entity that generates the IC design layout 122 and the entity that generates the testlines 126 may be the same entity, or different entities.

The mask house 130 uses the IC design layout 122 and optionally the testlines 126 to manufacture one or more masks to be used for fabricating the various layers of the IC device 160 where the IC design layout 122 and the testlines 126 may be placed next to each other on the mask(s). The mask house 130 performs mask data preparation 132 and mask fabrication 144. The mask data preparation 132 translates the IC design layout 122 and the testlines 126 into a form that can be physically written by a mask writer. The mask fabrication 144 fabricates one or more masks to have layers of patterns of the IC design layout 122 and the testlines 126. In the present embodiment, the mask data preparation 132 and mask fabrication 144 are illustrated as separate elements. However, they can be collectively referred to as mask data preparation.

The mask data preparation 132 includes a variety of operations, such as an optical proximity correction (OPC) 136 and a lithography process checking (LPC) 138. OPC 136 uses lithography enhancement techniques to compensate for image errors, such as those that can arise from diffraction, interference, or other process effects. OPC 136 may add assist features, such as scattering bars, serif, and/or hammerheads to the IC design layout 122 and the testlines 126 according to optical models or rules such that, after a lithography process, a final pattern on a wafer is improved with enhanced resolution and precision. In an embodiment, OPC 136 processes the IC design layout 122 and the testlines 126 individually so as to improve cycle time. The mask data preparation 132 can include further resolution enhancement techniques, such as off-axis illumination, sub-resolution assist features, phase-shifting masks, other suitable techniques, or combinations thereof. LPC 138 simulates processing that will be implemented by the IC manufacturer 150 to fabricate the IC device 160. The processing can include various processes of the IC manufacturing cycle, tools used for manufacturing the IC, and/or other aspects of the manufacturing process. LPC 138 takes into account various factors, such as aerial image contrast, depth of focus ("DOF"), mask error sensitivity ("MEEF"), other suitable factors, or combinations thereof.

The above description of the mask data preparation 132 has been simplified for the purposes of clarity, and data preparation may include additional features such as a logic operation (LOP) to modify the IC design layout according to manufacturing rules, a resolution enhancement technique (RET) to modify the design layouts to compensate for limitations in lithographic processes used by IC manufacturer 150. Additionally, the processes applied to the IC design layout 122 and the testlines 126 during data preparation 132 may be executed in a variety of different orders.

After mask data preparation 132 and during mask fabrication 144, a mask or a group of masks are fabricated based on the modified IC design layout 122 and the modified testlines 126. For example, an electron-beam (e-beam) or a mechanism of multiple e-beams is used to form a pattern on a mask (photomask or reticle) based on the layouts 122 and 126. In an embodiment, the testlines 126 are placed abutting the IC design layout 122 on a mask. Furthermore, the mask can be formed in various technologies. In an embodiment, the mask is formed using a binary technology where a mask pattern includes opaque regions and transparent regions. A radiation beam, such as an ultraviolet (UV) beam, used to expose the image sensitive material layer (e.g., photoresist) coated on a substrate, is blocked by the opaque region and transmits through the transparent regions. In an example, a binary mask includes a transparent substrate (e.g., fused quartz) and an opaque material (e.g., chromium) coated in the opaque regions of the mask. In another example, the mask is formed using a phase shift technology where various features in the pattern formed on the mask are configured to have proper phase difference to enhance the resolution and imaging quality. In various examples, the phase shift mask can be attenuated PSM or alternating PSM.

The IC manufacturer 150, such as a semiconductor foundry, uses the mask (or masks) fabricated by the mask house 130 to fabricate the IC device 160. The IC manufacturer 150 is a IC fabrication business that can include a myriad of manufacturing facilities for the fabrication of a variety of different IC products. For example, there may be a manufacturing facility for the front end fabrication of a plurality of IC products (i.e., front-end-of-line (FEOL) fabrication), while a second manufacturing facility may provide the back end fabrication for the interconnection and packaging of the IC products (i.e., back-end-of-line (BEOL) fabrication), and a third manufacturing facility may provide other services for the foundry business.

In an embodiment, a semiconductor wafer is fabricated using the mask (or masks) to form the IC device 160. The testlines 126 are also formed onto the semiconductor wafer and are used for at least monitoring the wafer fabrication process. The semiconductor wafer includes a silicon substrate or other proper substrate having material layers formed thereon. Other proper substrate materials include another suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The semiconductor wafer may further include various doped regions, dielectric features, and multilevel interconnects (formed at subsequent manufacturing steps). The mask may be used in a variety of processes. For example, the mask may be used in an ion implantation process to form various doped regions in the semiconductor wafer, in an etching process to form various etching regions in the semiconductor wafer, and/or other suitable processes.

After wafer fabrication, the IC device 160 is cut out of the wafer 152 individually, packaged, and tested before being delivered to market. The testlines 126 are usually used by the IC manufacturer 150 internally and therefore they are usually not packaged.

Figure 2B:
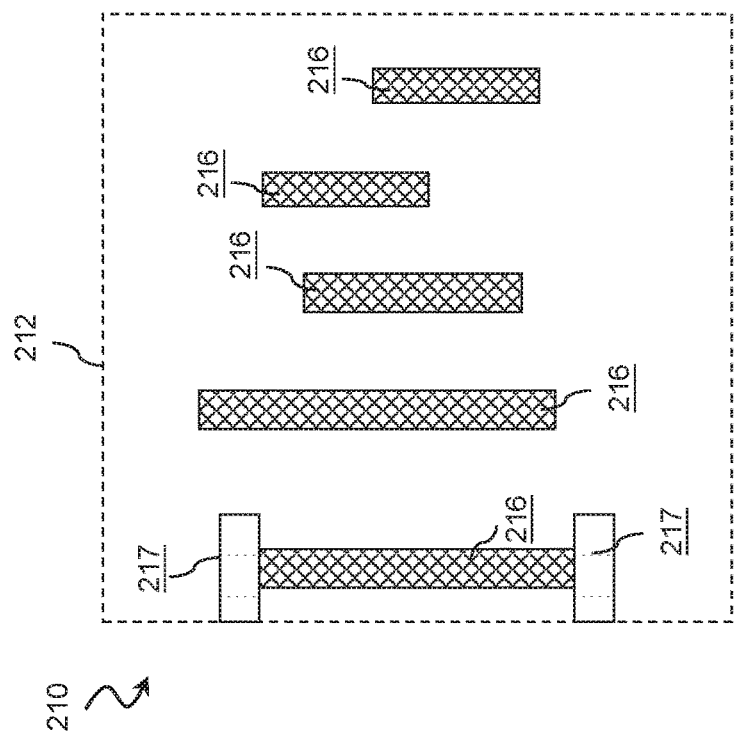
FIGS. 2A and 2B show exemplary devices in the IC manufacturing flow of FIG. 1, in accordance with an embodiment.
Figure 2A:
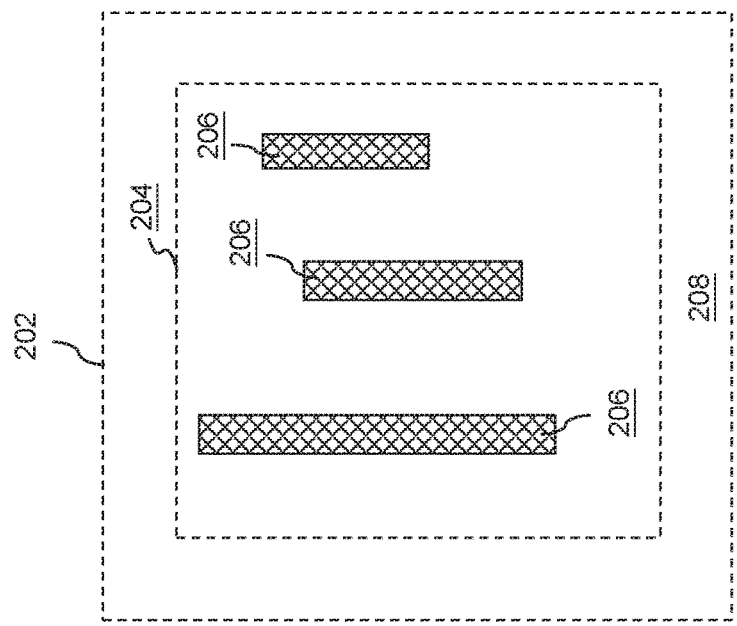

FIG. 2A is an example of a device (layout) 200 which is enclosed by an imaginary device boundary 202. The device 200 includes a plurality of main patterns 206. The main patterns 206 are portions of IC features such as active regions, gate electrodes, sources and drains, metal lines, interlayer interconnection vias, and openings for bonding pads that may be formed in a semiconductor substrate (such as a silicon wafer) and various material layers disposed over the semiconductor substrate. The main patterns 206 are placed in a main pattern region as defined by an imaginary main pattern boundary 204. An isolation region 208 is thus defined between the two boundaries 204 and 202. The isolation region 208 does not include any main patterns.

In an embodiment, the device 200 is an IC design layout, such as the IC design layout 122, and the isolation region 208 includes a seal ring. The seal ring isolates the active silicon area from external environment, such as humidity. It also protects the active silicon area, particularly the edges, when the device 200 is cut out of a wafer after fabrication.

In the present embodiment, the device 200 is a testline, such as the testline 126. The isolation region 208 is defined so as to prevent a bridging issue when the device 200 is placed abutting another device on a mask. For example, FIG. 2B illustrates a device 210 that does not include an isolation region, such as the isolation region 208. As a result, its main patterns 216 are placed close to its device boundary 212. When the device 210 is prepared for mask fabrication, it is modified by an OPC process, such as the OPC 136, to include OPC patterns 217. Some of the OPC patterns 217 overlap with the device boundary 212 and will undesirably bridge (or short) the device 210 with another device nearby. In the present embodiment, the dimension of the isolation region 208 is prescribed by the IC manufacturer 150 depending on the semiconductor process technology and the process layer where the main patterns 206 are to be formed thereon. For example, in a polysilicon-gate layer of a 22 nm process technology node, the isolation region 208 may be greater than or equal to 0.66 micron (um).

Figure 3:
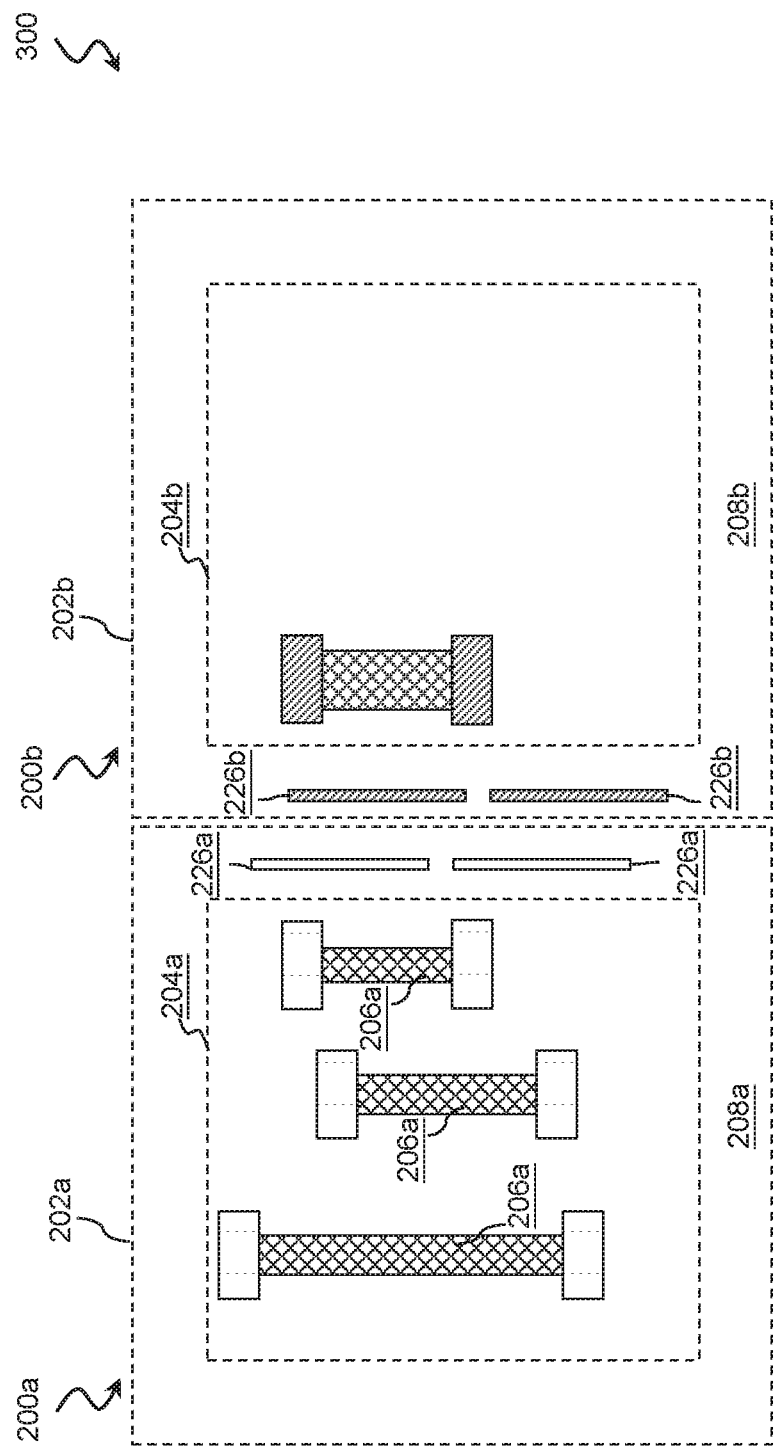
FIG. 3 illustrates a portion of a mask in the IC manufacturing flow of FIG. 1, in accordance with an embodiment.

However, leaving the isolation region 208 of the testline 200 unoccupied by any pattern may not be desirable. One reason is that an OPC process, such as the OPC 136 (FIG. 1), generally operates inside the device boundary 202. Consequently, some sub-resolution assist features, such as scattering bars, may be inserted in the isolation region 208 for enhancing the image fidelity of the main patterns 206. Sometime, these sub-resolution assist features may cause printing issues themselves. Referring to FIG. 3, a portion of a mask 300 includes a device 200a abutting another device 200b. The devices 200a and 200b are structurally similar to the device 200 with device boundaries 202a and 202b, main pattern boundaries 204a and 204b, and isolation regions 208a and 208b, respectively. Both the devices 200a and 200b have undergone an OPC process individually. As illustrated in FIG. 3, sub-resolution assist features 226a are inserted into the device 200a in an OPC process, while sub-resolution assist features 226b are inserted into the device 200b in another OPC process. Although not shown, sub-resolution assist features may also be inserted inside the main pattern boundaries 204a and 204b. When the device 200a (200b) is processed and optionally simulated by the OPC process without the device 200b (200a) abutting, the assist features 226a (226b) do not resolve into any images onto a wafer due to their dimensions, local pattern density, and target exposure energy, among other factors. However, when the device 200a is placed close to the device 200b on the mask 300, the assist features 226a and/or 226b may accidentally resolve into images onto wafers due to changed local pattern density on the mask. This is undesirable even though the images are in the isolation regions 208a and/or 208b of the respective devices. One reason is that the images of the assist features 226a and/or 226b are very thin and may cause peeling issues or other deformation issues.

Although FIG. 3 illustrates two devices as testlines, the aforementioned sub-resolution assist feature printing issue may occur when at least one of the abutting devices is a testline whose isolation region is unoccupied prior to an OPC processing.

Figure 4:
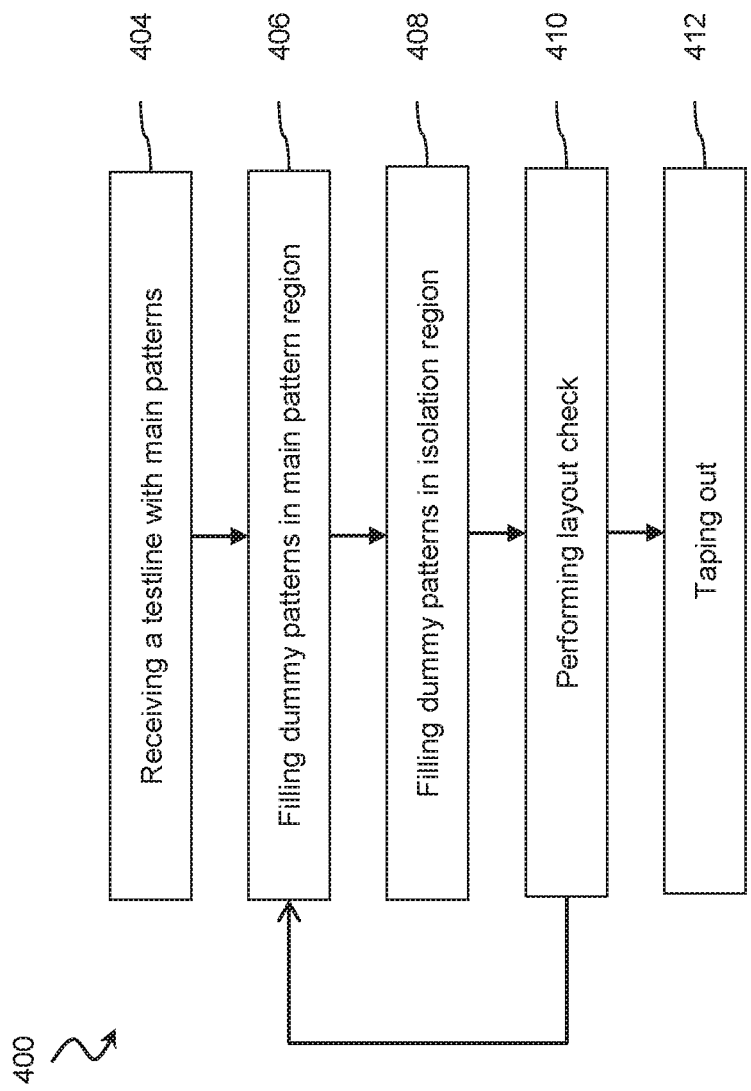
FIG. 4 is a flow chart of preparing a device layout according to various aspects of the present disclosure.

FIG. 4 illustrates a method 400 of designing a testline to address the above printing issue according to various aspects of the present disclosure. FIG. 4 will be described in conjunction with FIGS, 5A-5C.

The method 400 (FIG. 4) receives a testline 500 (FIG. 5A) at operation 404. Referring to FIG. 5A, the testline 500 is structurally similar to the testline 200 (FIG. 2A), having a device boundary 502 and a main pattern boundary 504. The testline 500 includes a plurality of main patterns 506 inside the main pattern boundary 504. In the present embodiment, the main patterns 506 are polysilicon gate patterns for forming transistors. The main patterns 506 have been laid out according to layout design rules prescribed by the IC manufacture 150 for the polysilicon layer. The layout design rules specify certain geometric constraints on the main patterns 506 necessary for manufacturing, such as minimum allowable dimensions, minimum spacing among the main patterns 506, and so on. Moreover, an isolation region 508 is defined in between the main pattern boundary 504 and the device boundary 502. The isolation region 508 has a minimum width W according to testline layout design rules prescribed by the IC manufacture 150 for the polysilicon layer. In an embodiment, the testline 500 is to be fabricated in a 22 nm process node and the dimension W is not less than 0.66 um.

The method 400 (FIG. 4) proceeds to operation 406 to insert a first plurality of dummy patterns inside the main pattern boundary 504. Referring to FIG. 5B, an exemplary dummy pattern 530 is inserted. In the present embodiment, the dummy pattern 530 is a polysilicon pattern but it does not form transistors. In an embodiment, the dummy pattern 530 is inserted for achieving uniform pattern density so as to improve photolithography process window for the main patterns 506. In another embodiment, the dummy pattern 530 is filled inside the main pattern boundary 504 so as to enable planarization through a standard chemical mechanical polishing (CMP).

Figure 5C:
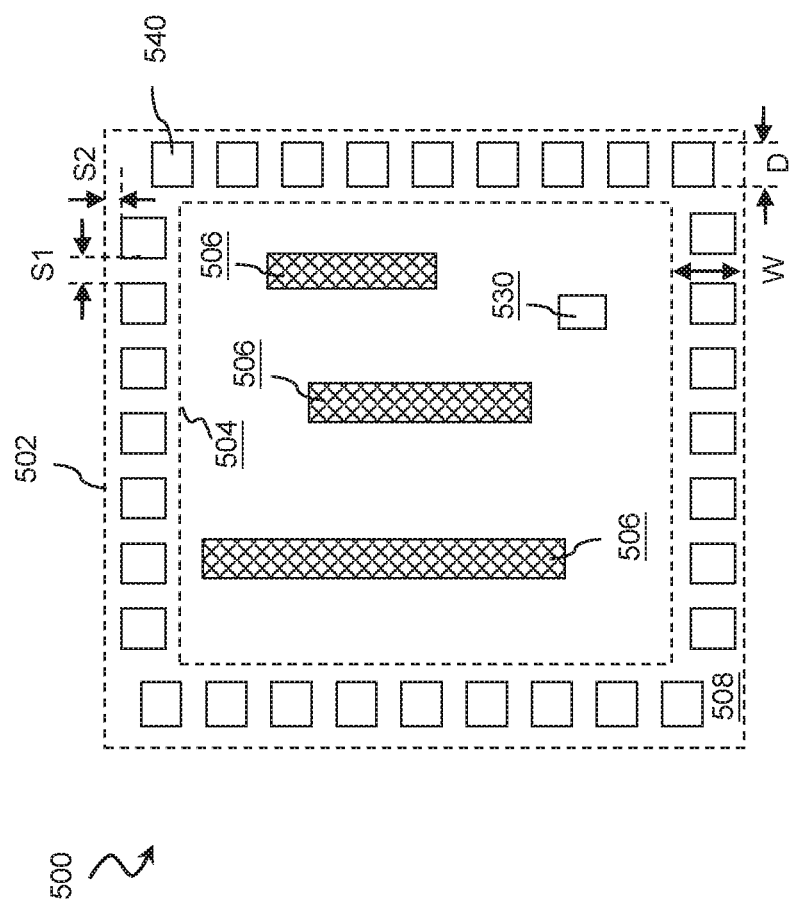
FIGS. 5A-7 illustrate various embodiments of device layouts.

The method 400 (FIG. 4) proceeds to operation 408 to fill the isolation region 508 with a second plurality of dummy patterns 540 (FIG. 5C). Referring to FIG. 5C, in the present embodiment, each of the dummy patterns 540 has a square shape with a dimension D. The dummy patterns 540 are arranged side by side and are spaced from each other by a dimension S1. The dummy patterns 540 are placed inside the device boundary 502 and are spaced away from the device boundary 502 by a dimension S2.

The selection of the dimensions D, S1, and S2 conforms to a set of rules. The dimension S1 meets a layout design rule prescribing a minimum spacing between two lithographically printable features, particularly among the dummy patterns 540, which provides a lower bound for the dimension S1. At the same time, the dimension S1 meets a layout design rule prescribing a maximum spacing between two lithographically printable features such that there is no room for inserting sub-resolution assist features in the space between two adjacent dummy patterns 540, which provides an upper bound for the dimension S1. Alternatively, the upper bound of the dimension S1 can be determined by running a simulation with a targeted OPC process. In an embodiment, the simulation starts with a large initial value for the dimension S1, and reduces the dimension S1 until no sub-resolution assist features are inserted between two adjacent dummy patterns 540. In another embodiment, the simulation starts with the lower bound of the dimension S1, increases the dimension S1one incremental step at a time until a first sub-resolution assist feature is inserted, and thereafter reduces the dimension S1 one incremental step back. Other methods for determining the lower and upper bounds of the dimension S1 are possible.

The dimension S2 meets a layout design rule prescribing a minimum spacing between two features when the testline 500 is placed abutting another device, which provides a lower bound for the dimension S2. In an embodiment, the testline 500 is placed abutting another device with a structure similar to the testline 500, and the dimension S2 is about half of the dimension S1. At the same time, the dimension S2 is small enough so as not to leave room for inserting sub-resolution assist features in the space between the dummy patterns 540 and the device boundary 502, which provides an upper bound for the dimension S2. Similarly, finding the upper bound of S2 can be based on a layout design rule, simulations with an OPC process, or combinations thereof.

The dimension D is lower-bounded by a layout design rule prescribing minimum feature sizes for forming features at the layer where the dummy patterns 540 are placed. The dimension D is upper-bounded by the requirements of the dimensions Si and S2 discussed above, as well as a minimum spacing between the dummy patterns 540 and the main pattern boundary 504. In an embodiment, the dummy patterns 540 have an attribute, as defined in a computer-aided design (CAD) layer, which prevents their shapes from being modified by an OPC process.

In an embodiment where the main patterns 506 are active region patterns implemented in a 22 nm process node, the dimension W is greater than or equal to 0.66 um, the dimension S1 is greater than or equal to 0.26 um, the dimension S2 is greater than or equal to 0.13 um, and the dimension D is about 0.21 um. In another embodiment where the main patterns 506 are polysilicon gate patterns implemented in a 22 nm process node, the dimension W is greater than or equal to 0.66 um, the dimension S1 is greater than or equal to 0.26 um, the dimension S2 is greater than or equal to 0.13 um, and the dimension D is about 0.26 um.

One benefit of placing dummy patterns 540 in the isolation region 508 pursuant to the aforementioned manner is that the pattern density of the dummy patterns 540 in the isolation region 508 is so high that an OPC operation is not needed in the isolation region 508. This prevents sub-resolution features, such as scattering bars, to be inserted in the isolation region 508, thus avoids the accidental sub-resolution feature printing and peeling issues discussed above. Another benefit is that the dummy patterns 540 are placed around the main patterns 506 so as to enhance the resolution of the main patterns 506 in a photolithography process.

In an embodiment, the method 400 (FIG. 4) may perform the operations 406 and 408 in different orders, or may perform them as one operation.

The method 400 (FIG. 4) proceeds to operation 410 to perform a layout check to the testline 500. The operation 410 includes a design rule check (DRC) and a layout vs. schematic (LVS) check. The DRC is performed on the physical layout of the testline 500, including the dummy patterns 540, to verify that the manufacturer concerned process requirements have been satisfied. The LVS check is performed such that the test devices and interconnects are extracted to generate a netlist for comparison with an original testline netlist. The dummy patterns 530 and 540 are excluded in the LVS check. If there are design rule violations due to the placement of the dummy patterns 530 and/or 540, the operation 410 adjusts the placement of the dummy patterns 530 and/or 540 accordingly until the design rule check passes. In an embodiment, if there are design rule violations due to the types of dummy patterns used or there are simply too many design rule violations to be adjusted one-by-one, the method 400 may adjust the types of the dummy patterns to be used, and repeat the operations 406, 408, and 410.

When the operation 410 indicates that the testline layout 500 is satisfactory, the method 400 proceeds to operation 412 to generate data files for the mask house 130 (FIG. 1). For example, the testline layout 500 can be expressed in a GDSII file format (or DFII file format).

Figure 7:
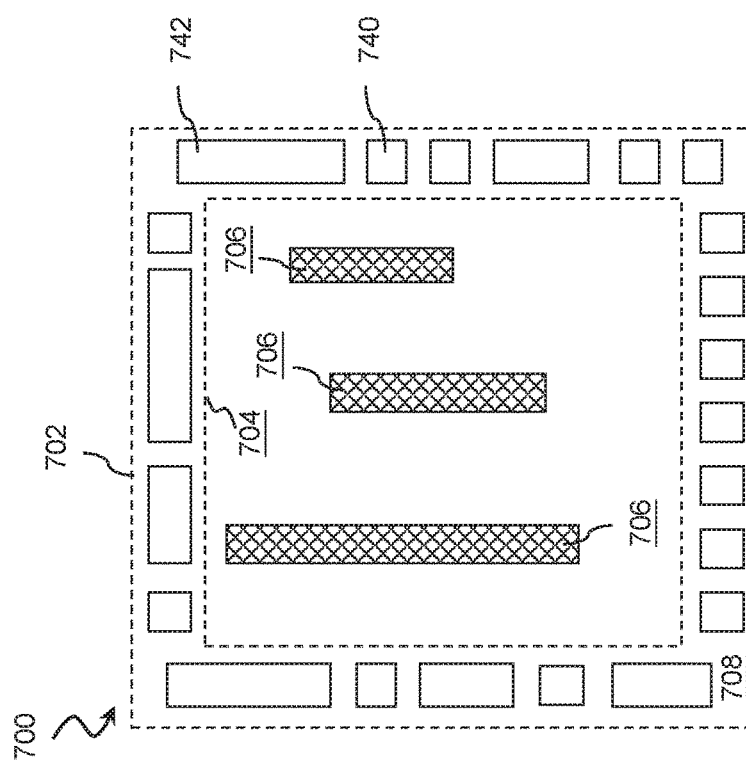
Figure 6:
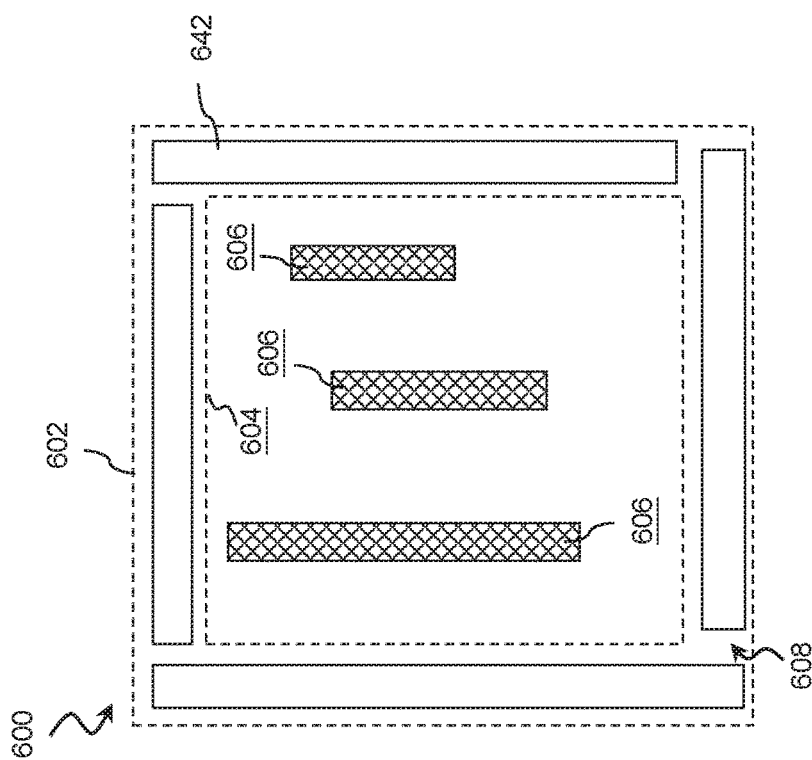

In an embodiment, dummy patterns in an isolation region of a testline, such as dummy patterns 540, may have rectangular shapes, or a mixture of rectangular and square shapes. Referring to FIG. 6, a testline 600 is structurally similar to the testline 500, with a device boundary 602, a main pattern boundary 604, and main patterns 606. The testline 600 further includes four dummy patterns 642 in an isolation region 608, with one dummy pattern 642 disposed at each side of the main pattern boundary 604. The dimensions of the dummy patterns 642, the spacing among them, and the spacing between the dummy patterns 642 and the boundaries 602 and 604 similarly conform to the rules discussed above in reference to FIG. 5C. As a result, the dummy patterns 642 enhance the resolution of the main patterns 606 in a lithography process and also prevent sub-resolution assist features to be inserted into the isolation region 608. Referring to FIG. 7, a testline 700 is structurally similar to the testline 500, with a device boundary 702, a main pattern boundary 704, and main patterns 706. The testline 700 further includes a mixture of square dummy patterns 740 and rectangular dummy patterns 742 in its isolation region 708. The dummy patterns 740 and 742 in testline 700 follow similar design and spacing rules as discussed above in reference to FIG. 5C.

Figure 8:
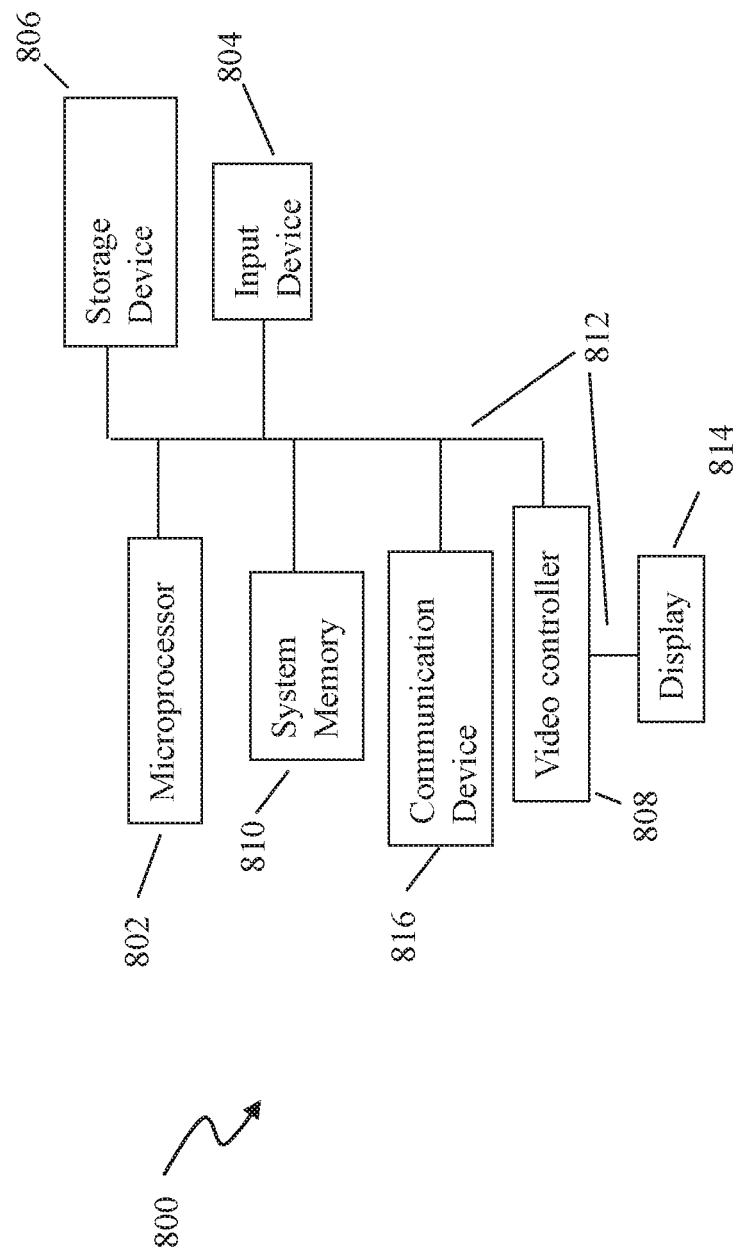
FIG. 8 is an illustration of a computer system for implementing one or more embodiments of the present disclosure.

Referring now to FIG. 8, shown therein is an illustrative computer system 800 for implementing embodiments of the method 400 described above. One example is to simulate an OPC processing while placing the dummy patterns 540 in the isolation region 508 and let the computer adjust the various dimensions D, S1, and S2 (FIG. 5C) automatically while running the OPC simulation, Computer system 800 includes a microprocessor 802, an input device 804, a storage device 806, a video controller 808, a system memory 810, a display 814, and a communication device 816 all interconnected by one or more buses 812. The storage device 806 could be a floppy drive, hard drive, CD-ROM, optical drive, or any other form of storage device. The storage device 806 may be capable of receiving a floppy disk, CD-ROM, DVD-ROM, or any other form of computer-readable medium that may contain computer-executable instructions. The communication device 816 could be a modem, network card, or any other device to enable the computer system to communicate with other nodes. In addition, any computer system could represent a plurality of interconnected (whether by intranet or Internet) computer systems, including without limitation, personal computers, mainframes, PDAs, and cell phones.

A computer system typically includes at least hardware capable of executing machine readable instructions, as well as the software for executing acts (typically machine-readable instructions) that produce a desired result. In addition, a computer system may include hybrids of hardware and software, as well as computer sub-systems.

Hardware generally includes at least processor-capable platforms, such as client-machines (also known as personal computers or servers), and hand-held processing devices (such as smart phones, personal digital assistants (PDAs), or personal computing devices (PCDs), for example). Further, hardware may include any physical device that is capable of storing machine-readable instructions, such as memory or other data storage devices. Other forms of hardware include hardware sub-systems, including transfer devices such as modems, modem cards, ports, and port cards, for example.

Software includes any machine code stored in any memory medium, such as RAM or ROM, and machine code stored on other devices (such as floppy disks, flash memory, or a CD ROM, for example). Software may include source or object code, for example. In addition, software encompasses any set of instructions capable of being executed in a client machine or server.

Combinations of software and hardware could also be used for providing enhanced functionality and performance for certain embodiments of the present disclosure. One example is to directly manufacture software functions into a silicon chip. Accordingly, combinations of hardware and software are also included within the definition of a computer system and are thus envisioned by the present disclosure as possible equivalent structures and equivalent methods.

Computer-readable mediums include passive data storage, such as a random access memory (RAM) as well as semi-permanent data storage such as a compact disk read only memory (CD-ROM). In addition, an embodiment of the present disclosure may be embodied in the RAM of a computer to transform a standard computer into a new specific computing machine.

Data structures are defined organizations of data that may enable an embodiment of the present disclosure. For example, a data structure may provide an organization of data, or an organization of executable code. Data signals could be carried across transmission mediums and store and transport various data structures, and, thus, may be used to transport an embodiment of the present disclosure.

The system may be designed to work on any specific architecture. For example, the system may be executed on a single computer, local area networks, client-server networks, wide area networks, internets, hand-held and other portable and wireless devices and networks.

A database may be any standard or proprietary database software, such as Oracle, Microsoft Access, SyBase, or DBase II, for example. The database may have fields, records, data, and other database elements that may be associated through database specific software. Additionally, data may be mapped. Mapping is the process of associating one data entry with another data entry. For example, the data contained in the location of a character file can be mapped to a field in a second table. The physical location of the database is not limiting, and the database may be distributed. For example, the database may exist remotely from the server, and run on a separate platform. Further, the database may be accessible across the Internet. Note that more than one database may be implemented.

The foregoing outlines features of several embodiments so that those with ordinary skill in the art may better understand the aspects of the present disclosure. Those with ordinary skill in the art should appreciate that they may readily use the present disclosure as a basis for designing or modifying other processes and structures for carrying out the same purposes and/or achieving the same advantages of the embodiments introduced herein. Those with ordinary skill in the art should also realize that such equivalent constructions do not depart from the spirit and scope of the present disclosure, and that they may make various changes, substitutions, and alterations herein without departing from the spirit and scope of the present disclosure.

In one exemplary aspect, the present disclosure is directed to an integrated circuit (IC) design method. The method includes receiving a layout of an integrated circuit (IC) device, wherein the layout has an outer boundary and an inner boundary thereby defining a first region between the outer boundary and the inner boundary and the layout further includes main patterns placed inside the inner boundary. The method further includes placing a first plurality of dummy patterns in the first region, wherein the first plurality of dummy patterns is lithographically printable and fills the first region in such a way that prevents sub-resolution assist features from being inserted into the first region by an optical proximate correction (OPC) process.

In another exemplary aspect, the present disclosure is directed to an integrated circuit (IC) testline layout having a device boundary and a main pattern boundary inside the device boundary. The IC testline layout includes at least one main pattern inside the main pattern boundary and a plurality of dummy patterns in a region that is between the main pattern boundary and the device boundary. The plurality of dummy patterns is printable in a photolithography process and is arranged in a ring with a uniform spacing between two adjacent dummy patterns.

In another exemplary aspect, the present disclosure is directed to an integrated circuit (IC) photo mask. The IC photo mask includes a first plurality of IC features of a first IC device, wherein the first plurality of IC features is enclosed by a first inner boundary and the first inner boundary is enclosed by a first outer boundary thereby defining a first region between the first outer boundary and the first inner boundary. The IC photo mask further includes a first plurality of dummy features in the first region, wherein the first plurality of dummy features are printable in a photolithography process and has about uniform density in the first region.

What is claimed is:
1. A method comprising:
receiving a layout of an integrated circuit (IC) device, the layout having an outer boundary and an inner boundary thereby defining an isolation region between the outer boundary and the inner boundary;
placing dummy patterns in the isolation region, wherein the dummy patterns are lithographically printable; and performing an Optical Proximity Correction (OPC) process, the dummy patterns being positioned within the isolation region in such a way that prevents sub-resolution assist features from being inserted into the isolation region by the OPC process.

2. The method of claim 1, wherein the layout further includes main patterns inside the inner boundary, and wherein the isolation region is free of main patterns.

3. The method of claim 1, wherein the dummy patterns include four rectangular patterns placed adjacent to four sides of the inner boundary and enclosing the inner boundary.

4. The method of claim 1, wherein each of the dummy patterns has a square shape.

5. The method of claim 1, wherein the dummy patterns are spaced away from each other by a dimension that meets a layout design rule prescribing a minimum spacing between two lithographically printable features and further meets another layout design rule prescribing a maximum spacing between two lithographically printable features such that there is no room for inserting sub-resolution assist features in a space between two adjacent dummy patterns.

6. The method of claim 1, wherein the dummy patterns are spaced away from the outer boundary by a dimension that meets a layout design rule prescribing a minimum spacing between two features when the layout is placed abutting another layout and is further small enough so as not to leave room for inserting sub-resolution assist features in a space between the dummy patterns and the outer boundary.

7. The method of claim 1, wherein the dummy patterns have an attribute that prevents their shapes from being modified by the OPC process.

8. The method of claim 1, wherein the layout further includes main patterns for fabricating testlines inside the inner boundary.

9. An integrated circuit (IC) layout having a device boundary and a main pattern boundary inside the device boundary, comprising:
dummy patterns in an isolation region that is between the main pattern boundary and the device boundary, wherein:

the dummy patterns are printable in a photolithography process;
the dummy patterns surround the main pattern boundary; and
the isolation region is free of sub-resolution assist features.

10. The IC layout of claim 9, further comprising at least one main pattern inside the main pattern boundary.

11. The IC layout of claim 9, wherein the isolation region is free of main patterns.

12. The IC layout of claim 9, further comprising sub-resolution assist features inside the main pattern boundary.

13. The IC layout of claim 9, wherein the dummy patterns include four rectangular patterns placed adjacent to four sides of the main pattern boundary and enclosing the main pattern boundary.

14. The IC layout of claim 9, wherein the dummy patterns include square patterns, rectangular patterns, or a mixture of square and rectangular patterns.

15. A photo mask, comprising:
main features of integrated circuit (IC) devices, wherein the main features are enclosed by an inner boundary that is enclosed by an outer boundary, defining an isolation region between the outer boundary and the inner boundary; and
dummy features in the isolation region, wherein the dummy features are printable in a photolithography process, wherein the isolation region is free of sub-resolution features.

16. The photo mask of claim 15, wherein the dummy features have about uniform density in the isolation region.

17. The photo mask of claim 15, further comprising sub-resolution features inside the inner boundary.

18. The photo mask of claim 15, wherein the IC devices include testlines.

19. The photo mask of claim 15, wherein the main features and the dummy features are in an area of the photo mask that corresponds to a scribe line area of a wafer.

20. The photo mask of claim 15, wherein the dummy features include square patterns, rectangular patterns, or a mixture of square and rectangular patterns.

* * * * *